United States Patent [19]
Seelert et al.

[11] Patent Number: 5,954,978
[45] Date of Patent: Sep. 21, 1999

[54] SUBSTRATE, A MODULE AND A METHOD FOR FASTENING COMPONENTS OF THE MODULE TO THE SUBSTRATE

[75] Inventors: Wolf Seelert, Lubeck; Rudiger Von Elm, Kuhren, both of Germany

[73] Assignee: Adlas Lasertechnik GmbH & Co., KG, Lubeck, Germany

[21] Appl. No.: 08/738,072

[22] Filed: Oct. 25, 1996

[30] Foreign Application Priority Data

Oct. 27, 1995 [DE] Germany ............... 195 40 140

[51] Int. Cl.⁶ ................................................ H05B 1/00
[52] U.S. Cl. ............................................................ 219/209
[58] Field of Search ................. 219/209, 544, 219/548, 229, 210, 338, 121.6, 85.16, 228; 165/47; 428/615; 338/48, 252, 276, 311, 312; 385/135

[56] References Cited

U.S. PATENT DOCUMENTS

| | | | |
|---|---|---|---|
| 3,775,725 | 11/1973 | Endo et al. | 338/262 |
| 4,854,667 | 8/1989 | Ebata et al. | 350/96.2 |
| 4,946,246 | 8/1990 | Shiga et al. | 350/96.2 |
| 5,010,233 | 4/1991 | Henschen | 219/209 |
| 5,464,966 | 11/1995 | Gaitan | 219/544 |
| 5,527,627 | 6/1996 | Lautzenhiser | 428/615 |
| 5,539,186 | 7/1996 | Abrani | 219/548 |
| 5,635,893 | 6/1997 | Spraggin | 338/48 |
| 5,663,526 | 9/1997 | Card et al. | 174/52.1 |
| 5,669,437 | 9/1997 | Hernandez | 165/47 |

*Primary Examiner*—Teresa Walberg
*Assistant Examiner*—Jeffrey Pwu
*Attorney, Agent, or Firm*—Bacon & Thomas, PLLC

[57] ABSTRACT

Module-forming component secured to a substrate using heat activated bonding arrangements are made by resistance heating the bonding medium, for example solder, thermal activated adhesive or thermoplastic material, using electrically energized resistance elements, for example thick film resistance layers, secured to the side of the substrate opposite the side on which the components are secured.

20 Claims, 2 Drawing Sheets

SUBSTRATE, A MODULE AND A METHOD FOR FASTENING COMPONENTS OF THE MODULE TO THE SUBSTRATE

BACKGROUND OF THE INVENTION

1. Field of the Invention

This invention relates to a plate-shaped substrate for building up a module with mechanical, electronic or optical components with local heating resistors for applying heat during the fastening of the components to fastening positions on the substrate, and to a thus built up module and a method for fastening components to such a substrate.

2. Discussion of Related Technology

A substrate and a module of the described type have become known from GB 8 609 858. The known module contains an end of an optical glass fiber fastened to a substrate, a diode laser coupled optically to this fiber end, and further optical and electronic components. The fiber end is soldered on the substrate by briefly heating the substrate during the soldering process through a thick-film resistor mounted in the area of a metalized fastening position.

The substrate consists of a ceramic plate with ground surfaces and conductive paths applied by thick-film technology and then covered with an insulating layer. In the area of the fastening position for the fiber end a thick-film resistor with leads is disposed on the insulating layer and covered with a second insulating layer. On this second insulating layer a metalized surface is provided over the thick-film resistor.

During assembly of the module the fiber end is suitably aligned on the metalized surface and the thick-film resistor heated by supplied current, which causes supplied solder to melt. Then the supply of current is interrupted, the solder hardens and fixes the fiber end.

The disadvantage of the known module is that up to six layers of conductive and nonconductive material must be disposed one on the other on the substrate. This makes production elaborate and expensive and the stability of the layer structure can suffer.

The objective of this invention is to provide a substrate and a module to be built up therewith of the described type which avoids the disadvantages of the known module.

BRIEF SUMMARY OF THE INVENTION

It was discovered that the above problem can be solved if the components of the module and their corresponding heating resistor are disposed on opposite surfaces of the substrate. The substrate is made so that a heating resistor is disposed in the area of fastening positions of components on the opposite surface.

The invention is advantageous in that one can fasten components to a nonconductive substrate, if by soldering, by applying only one metallic layer to the fastening side and one layer of conductive material, e.g. in the form of thick-film resistors, to the opposite surface. Thus two layers are sufficient as opposed to the six layers which are necessary in the known module. If the components are fastened by gluing, one actually requires only one layer in the form of thick-film resistors. This considerably simplifies and cheapens production, makes the layer structure more stable and, since the components and the heating resistors are disposed on different sides of the substrate, gives the designer more layout freedom. In normal operation of the module the heating resistors can advantageously be used as ground surfaces.

As a substrate material one can use glass, ceramics (e.g. nitrite, carbide or oxide ceramics) or a crystalline material (e.g. sapphire).

The heating resistors and any metalized fastening position as well as electric leads to the heating resistors and possibly to components of the module are provided by vapor deposition on the substrate or preferably applied to the substrate by screen printing and then sintered onto the substrate under the action of heat (sintering obtaining a stronger connection of the metal with the substrate than by vapor deposition). The heating resistor leads disposed on the substrate are advantageously connected via wires with a plug fastened to the module or a housing receiving the module. During assembly current can then be conducted via this plug to the particular heating resistor required.

The components can fundamentally be fastened to the substrate by soldering or gluing. For soldering one must provide on the substrate a metalized rastening position, i.e. an area where metal has been vapor deposited on the substrate surface or applied thereto by screen printing and sintered onto the substrate. One preferably uses for this purpose readily solderable metals such as copper, nickel, silver or gold or metal alloys.

The leads, heating resistors and fastening positions can be made of different materials in different layer thicknesses. However they are preferably all made of the same material and in uniform layer thickness. To obtain the necessary ohmic resistance for the heating resistors, they are preferably formed as narrow bands wound in a serpentine shape. The resistance value can be influenced in a given material and at a given layer thickness by the width and the length of the band wound in a serpentine shape.

By varying the width (or the layer thickness or the material) of the band wound in a meander shape over the surface of a heating resistor one can influence the temperature profile arising during heating of the heating resistor. If the band wound in a serpentine shape is e.g. narrower toward the middle of the surface, the local resistance value of the heating resistor (i.e the resistance of the band wound in a serpentine shape per unit of length), and thus the power converted into heat in the band, also rises towards the middle. One thus obtains a higher temperature in the middle of the surface that at the edges thereof. In this way one can prevent a previously fastened neighboring component from becoming detached during the fastening process and excessive mechanical strains from building up in the substrate due to large temperature gradients.

In the area of the fastening positions a heating resistor is disposed on the opposite surface of the substrate. If the fastening position is disposed e.g. on the upper surface of the substrate, the corresponding heating resistor is located on the lower surface of the substrate. Components can be disposed on the upper side and additionally on the underside of the substrate. The corresponding heating resistors are then located accordingly on the underside and the upper side of the substrate.

For soldering on the module components one preferably pre-tins the fastening positions and the components or the metalized surfaces thereof. Each component is placed on the fastening position provided therefor and can, if necessary, be thereby held and aligned with suitable means. One can use e.g. a positioning device adjustable about three spatial axes and three angles which holds the component e.g. by vacuum suction means. Then the corresponding heating resistor is excited so that the substrate heats up in the area of the fastening position above the melting temperature of the solder. It is also possible now to feed solder from the side or add more solder. The component can be positioned exactly in the liquid solder. Then the current supply to the corresponding heating resistor is interrupted, the substrate and thus the solder cool, the solder hardens and fixes the component on the substrate.

If one fastens by gluing one can use e.g. a one- or two-component adhesive to glue the component to the substrate. It is in this case unnecessary to metalize the fastening position. For optimal gluing the adhesive must be brought to a certain temperature during hardening, which can be done by means of the corresponding heating resistor. It is also possible to establish an electric connection between the component and the fastening position by means of e.g. silver conductive adhesive.

The components can also be fastened by means of a thin plate of thermoplastic material disposed between substrate and component. Local heating of the substrate by means of the corresponding heating resistor causes said material to melt. Upon subsequent cooling the componant is connected with the substrate. The components are positioned the same way when glued and fastened with thermoplastic material as when soldered.

To prevent a previously fastened component from being detached or shifting when the neighboring component is fastened, it may be necessary to maintain a minimum distance between the components, which depends on the thickness of the substrate due to the lateral heat distribution within the substrate. A distance of twice the substrate thickness generally suffices. If the distance must be smaller for constructional reasons one can use for the component to be fastened first a solder which has a higher melting point than that used for the neighboring component.

BRIEF DESCRIPTION OF THE DRAWINGS

The invention will be explained with reference to an embodiment and the drawing, in which.

DETAILED DESCRIPTION OF THE INVENTION

Figure 1:
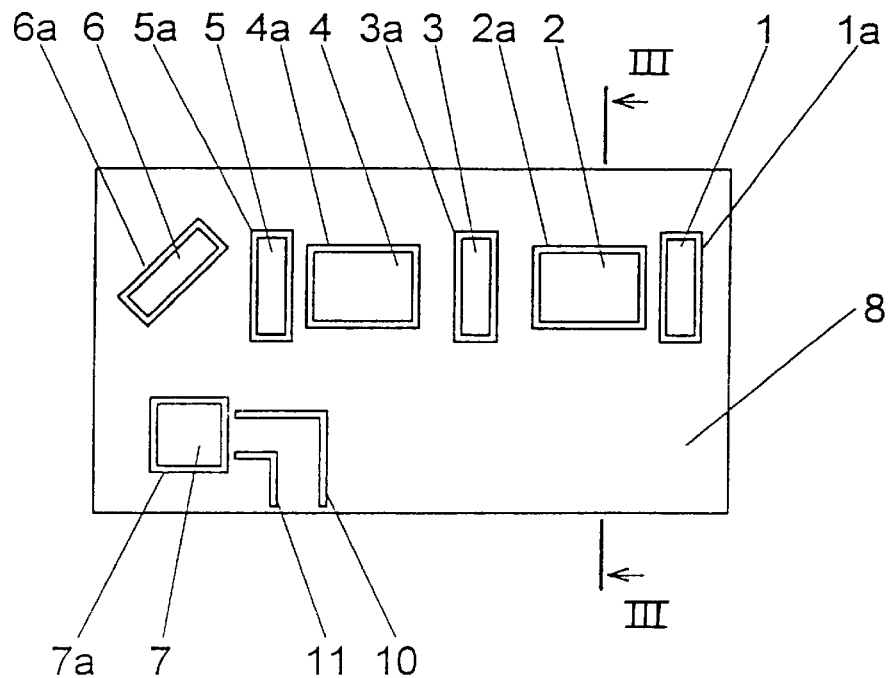
FIG. 1 shows a laser module from the upper side (the side to which the components are fastened)

The laser module shown in FIG. 1 consists of input mirror 1, Nd:YAG crystal 2 as a laser medium, polarizer 3, optically nonlinear crystal 4 for frequency doubling of the laser light, output mirror 5, semitransparent mirror 6 and photodiode 7. All components 1 to 7 are built up an a plate of aluminum oxide ceramics serving as substrate 8. Under each component 1 to 7 an area of substrate 8 is metalized as fastening position 1a to 7a. In this example these fastening positions are approx. 1 mm greater all around than components 1 to 7 to be fastened. It is also possible to make the fastening positions equally large as or smaller than the corresponding components.

Figure 2:
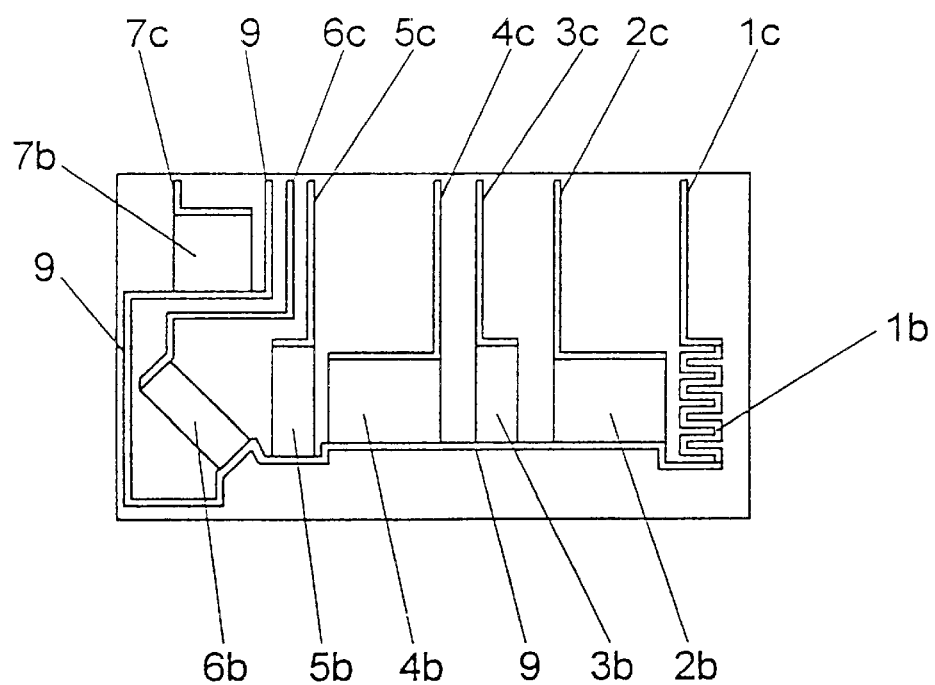
FIG. 2 shows the laser module from the underside.

FIG. 2 shows the underside of the substrate. At the places where fastening position 1a to 7a is found on the upper side, heating resistor 1b to 7b is disposed on the underside in each case. Heating resistors 1b to 7b are contacted on one side by common conductive path 9 and on the other side by one second conductive path 1c to 7c in each case. All conductive paths 1c to 7c, 9 are guided to an edge area of substrate 8. Wires can be soldered on or bonded here to connect the conductive paths with a plug (not shown) as an external connection.

Heating resistor 1b is shown by way of example as a band wound in a serpentine shape. The ohmic resistance of heating resistor 1b can be adjusted by varying the width of this band and the length thereof between conductive paths 1c and 9. Other heating resistors 2b to 7b are also formed in a serpentine shape but these are shown only as simple surfaces in the drawing for simplicity's sake.

On the upper side of the substrate (FIG. 1) two electric leads 10, 11 are guided from the edge of the substrate to the vicinity of fastening position 7a of photodiode 7. The terminals of photodiode 7 are connected via bonded wires with leads 10, 11.

Figure 3:
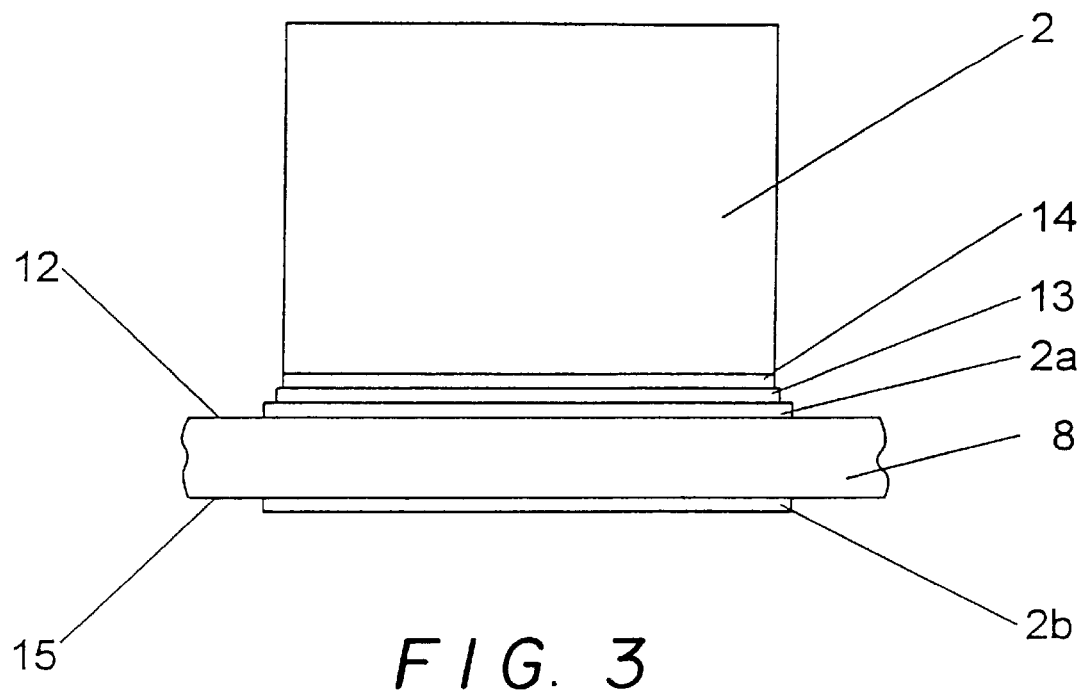
FIG. 3 shows a section through the laser module along line III—III of FIG. 1.

FIG. 3 shows an enlarged section through substrate 8 along the section marked III—III in FIG. 1. Disposed on upper side 12 of substrate 8 is fastening position 2a in the form of a metalized area of substrate 8. Located thereon is a thin layer of solder 13 with which Nd:YAG crystal 2 is soldered on substrate 8. Solder 13 is followed by metalized layer 14 of Nd:YAG crystal 2. This metalized layer is necessary with all nonmetallic components to make them solderable. Other components 1 to 7 are connected with the substrate in the same way.

On underside 15 of substrate 8 heating resistor 2b is disposed in the area which is under fastening position 2a. One heating resistor 1b to 7b is accordingly disposed in the area which is under other fastening positions 1 to 7 in each case. The heating resistors can be equally large as, larger or smaller than the corresponding fastening positions. A smaller design can be useful for reducing the action of heat on adjacent fastening positions.

The metalized areas of substrate 8 which form fastening positions 1a to 7a, heating resistors 1b to 7b and leads 1c to 7c, 9, 10, 11 are produced by applying to substrate 8 by screen printing a metalliferous paste which is then sintered onto the surface or substrate 8 at a suitable temperature.

Components 1 to 7 are soldered on metalized fastening positions 1a to 7a, For this purpose the fastening positions and the components or the metalized surfaces thereof have been pre-tinned. A component to be fastened is placed on the fastening position provided therefor, and held with vacuum suction means. Then the corresponding heating resistor is excited so that the substrate heats up in the area of the fastening position above the melting temperature of the solder. Now the component is aligned by means of a positioning device to which the vacuum suction means are fastened relative to three spacial axes and three angles. During alignment more solder can be added from the side, if necessary. After that the current supply to the corresponding heating resistor is interrupted, the substrate and thus the solder cool, the solder hardens and fixes the component on the substrate.

Figure 4:
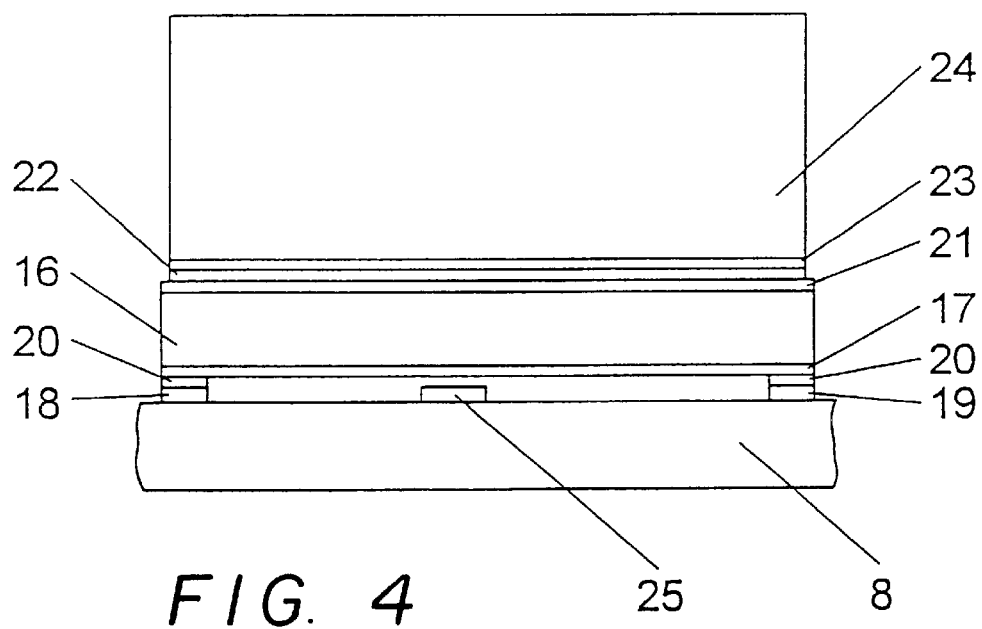
FIG. 4 shows a section through a substrate with a separate substrate piece fastened thereto like a bridge.

FIG. 4 shows a further embodiment of the invention in which separate substrate piece 16 is fastened like a bridge to substrate 8 shown in cross section. Disposed on the surface of separate substrate piece 16 facing substrate 8 is heating resistor 17. Two conductive paths 18, 19 are disposed on substrate 8 at the places which are under the ends of heating resistor 17. Separate substrate piece 16 is connected by means of solder 20 with conductive paths 18, 19, thereby fastening separate substrate piece 16 to substrate 8, on the one hand, and contacting heating resistor 17 electrically with conductive paths 18, 19, on the other hand. The surface of separate substrate piece 16 facing away from substrate 8 is provided with metal layer 21 on which component 24 likewise provided with metal layer 23 is soldered by means of solder 22. During the soldering process current is conducted via conductive paths 18, 19 through heating resistor 17, causing the latter to heat up and thus solder 22 to melt. The arrangement shown in FIG. 4 can be used advantageously if e.g. conductive path 25 mounted on substrate 9 must be bridged or if a heat sink is disposed on the surface of substrate 8 opposite the area intended for fastening component 24. This heat sink would largely prevent the heating up of a heating resistor disposed directly on substrate 8. The bridgelike arrangement of separate substrate piece 16 insulates heating resistor 17 thermally from substrate 8 and it is possible to solder on a component in the area of a heat sink disposed on the opposite side of substrate 8.

In the following the functioning of the laser module according to FIGS. 1 to 3 will be briefly explained.

The laser module is pumped by means of a laser diode (not shown) mounted on a carrier together with the module. The laser diode radiation passes as pumped radiation through input mirror 1 into Nd:YAG crystal 2, exciting the latter to emit laser radiation. This laser radiation passes through polarizer 3 into optically nonlinear crystal 4, is partly doubled in frequency here and leaves the laser module through output mirror 5. Semitransparent mirror 6 disposed on a slant behind output mirror 5 reflects a small portion of the laser radiation onto photodiode 7. The output signal from photodiode 7 is a measure of the intensity of the laser radiation and can be used e.g. for control purposes.

We claim:

1. A sheet-like substrate having module components attached thereto in predetermined locations, comprising:

a sheet-like substrate having opposed surfaces and predetermined positions defined on one surface thereof for receiving components of a module to be secured on the substrate by a heating procedure;

an electrical resistance element disposed on the opposite surface of the substrate opposite each such said predetermined positions for supplying thermal energy to said positions through the substrate when energized for carrying out the heating procedure;

said module components comprising optical components.

2. The substrate and module components according to claim 1, wherein said substrate consists of a material selected from the group consisting of glass, ceramics, and crystalline material.

3. The substrate and module components according to claim 2, wherein each resistance element comprises a thick film resistor permanently secured to the substrate.

4. The substrate and module components according to claim 2, wherein said positions are defined by metallized layers on the substrate formed by screen printing and sintering the metallized layer on the substrate.

5. The substrate and module components according to claim 4, wherein said resistance elements have associated leads and wherein the resistance element and the associated leads are defined by metallized layers on the substrate formed by screen printing and sintering of the metallized layers on the substrate.

6. The substrate and module components according to claim 2, wherein the ratio of the distance between adjacent predetermined positions on the substrate and the thickness between opposed substrate surfaces is at least 2.

7. The substrate and module components according to claim 2, wherein said predetermined positions are defined by metallized layers and said components are secured to said positions by solder that has been fused by the heating procedure.

8. The substrate and module components according to claim 2, wherein said predetermined positions are defined by a heat settable adhesive and said components are secured to said positions by adhesive that has been set by said heating procedure.

9. The substrate and module components according to claim 2, wherein said predetermined positions are defined by thermoplastic material and said components are secured to said positions by thermoplastic material that has been melted by said heating procedure.

10. The substrate and module components according to claim 2, including an additional substrate layer disposed generally parallel to but spaced away from the first-recited substrate on the side thereof opposite the side on which the resistance element is located.

11. The substrate and module components according to claim 10, wherein said predetermined positions are defined by metallized layers and said components are secured to said positions by solder that has been fused by said heating procedure.

12. The substrate and module components according to claim 10, wherein said predetermined positions are defined by a heat settable adhesive and said components are secured to said positions by said settable adhesive that has been heated to its setting temperature by said heating procedure.

13. The substrate and module components according to claim 10, wherein said predetermined positions are defined by a thermoplastic material and said components are secured to said positions by thermoplastic material that has been melted by said heating procedure.

14. The substrate and module components according to claim 10, including conductive leads for supplying said resistance elements with electric current; said substrates connected together by conductive connections; said conductive connections being connected to said conductive leads, whereby electrical current may be supplied from one substrate to the other to energize the resistance elements through the conductive connections.

15. A method for securing by a heating procedure at least one optical module component on one surface of a sheet-like substrate at a predetermined position on said one surface, comprising:

establishing said predetermined position on said one surface of the substrate;

placing an optical module component at said position; and heating the position through the substrate by an electrical resistance element secured to the opposite side of the substrate opposite at said at least one position to thereby secure said at least one optical module component to said surface at said position.

16. The process according to claim 15, wherein the substrate is selected from the group consisting of glass, ceramics and crystalline material, and the heating procedure is soldering and including placing soldering metal at said predetermined position between the optical module component and the substrate, heating the soldering metal to fusion temperature by the electrical resistance element, and cooling the soldering metal to its solidification temperature.

17. The process according to claim 15, wherein the substrate is selected from the group consisting of glass, ceramics and crystalline material, and the heating procedure is bonding using a heat settable adhesive, and including placing a heat settable adhesive at said predetermined position between said optical module component and said substrate, heating the adhesive to its setting temperature by the electrical resistance element, and cooling the heat settable adhesive.

18. The process according to claim 15, wherein the substrate is selected from the group consisting of glass, ceramics and crystalline material, and the heating procedure is bonding using a thermoplastic material, and including placing thermoplastic material at said predetermined position between said optical module component and said substrate, heating the thermoplastic material to its melting temperature using the electrical resistance element, and cooling the thermoplastic material to its solid temperature.

19. The process according to claim 15, wherein the substrate is selected from the group consisting of glass, ceramics and crystalline material, and including using a thick-film resistor permanently secured to the substrate for the resistance element.

20. The process according to claim 15, wherein the substrate is selected from the group consisting of glass, ceramics and crystalline material, and including securing multiple module optical components on said one surface of the substrate; establishing multiple predetermined positions on said one surface of the substrate; heating the said predetermined positions by a respective electrical resistance heating element permanently secured in thick-film form to the opposite side of the substrate opposite each position; and using serpentine configured shapes for the resistance element.

* * * * *